United States Patent
Smoszna

(10) Patent No.: US 6,384,665 B2
(45) Date of Patent: May 7, 2002

(54) METHOD AND CIRCUITRY FOR SOFT FUSE ROW REDUNDANCY WITH SIMPLE FUSE PROGRAMMING

(75) Inventor: Marek Smoszna, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/803,366

(22) Filed: Mar. 8, 2001

Related U.S. Application Data

(62) Division of application No. 09/453,977, filed on Dec. 2, 1999, now Pat. No. 6,281,736.

(51) Int. Cl.$^7$ .............................................. H01H 37/76
(52) U.S. Cl. ...................................... 327/525; 365/201
(58) Field of Search ............................... 327/525, 526; 365/200, 201, 225.7

(56) References Cited

U.S. PATENT DOCUMENTS

| | | | |
|---|---|---|---|
| 3,812,384 A | 5/1974 | Skorup | 365/154 |
| 4,287,442 A | 9/1981 | Spinks et al. | 327/212 |
| 4,874,971 A | 10/1989 | Fletcher | 327/399 |
| 5,189,315 A | 2/1993 | Akata | 327/203 |
| 5,272,388 A * | 12/1993 | Bakker | 327/525 |
| 5,298,816 A | 3/1994 | Kaplinsky | 327/427 |
| 5,337,278 A * | 8/1994 | Cho | 365/200 |
| 5,469,401 A * | 11/1995 | Gillingham | 365/230.06 |
| 5,604,756 A | 2/1997 | Kawata | 714/773 |
| 5,867,396 A | 2/1999 | Parlour | 716/18 |
| 5,889,414 A * | 3/1999 | Li et al. | 326/49 |
| 5,896,300 A | 4/1999 | Raghavan et al. | 716/10 |
| 5,953,236 A | 9/1999 | Hossain et al. | 716/6 |
| 6,246,623 B1 * | 6/2001 | Ingalls | 365/225.7 |
| 6,281,736 B1 * | 8/2001 | Smoszna | 327/365 |

OTHER PUBLICATIONS

IEEE Journal of Solid–State Circuits, vol. 31, No. 3, Mar. 1996, "A Scalable Pipelined Architecture for Fast Buffer SRAM's", C.J. Nicol and A. G. Dickinson, pp 419–429.

IEEE Journal of Solid–State Circuits, vol. 26, No. 1, Jan. 1991, "A Flexible Redundancy Technique for High–Density DRAM's" M. Horiguchi, J. Etoh, M. Aoki, K. Itoh, and T. Matsumoto, pp. 12–17.

* cited by examiner

*Primary Examiner*—Timothy P. Callahan
*Assistant Examiner*—Hai L. Nguyen
(74) *Attorney, Agent, or Firm*—Sierra Patent Group, Ltd.

(57) ABSTRACT

The present invention relates to the use of a programmable soft fuse for disabling a signal line using an electronic switching circuit, a latch, a control circuit, and a reset circuit. In another preferred embodiment, a precharge device is included.

A method of disabling a data line using a soft fuse is disclosed, where the steps are: providing a soft fuse having a control means, providing a memory array, providing an address decoder, connecting the soft fuse between the address decoder and the memory array, testing the memory array, locating a bad address line in the array, entering the location of the bad address line into the address decoder, and strobing the control means.

A further method is disclosed, which has the additional steps of: providing shifting circuitry, connecting the shifting circuitry to the address decoder, the soft fuse circuitry, and the memory array accepting data from the address decoder into the shifting circuitry, and providing the data to at least one predetermined row in the memory array.

4 Claims, 10 Drawing Sheets

METHOD AND CIRCUITRY FOR SOFT FUSE ROW REDUNDANCY WITH SIMPLE FUSE PROGRAMMING

CROSS-REFERENCE TO RELATED APPLICATION

This application is a Division of U.S. patent application Ser. No. 09/453,977, filed Dec. 2, 1999 now U.S. Pat. No. 6,281,736.

BACKGROUND OF THE INVENTION

1. Field of the Invention

The present invention relates to the disabling of signal lines. More particularly, the present invention relates to the use of programmable soft fuses for disabling address lines in an array of random access memory (RAM).

2. The Prior Art

The problems associated with the failure of individual memory cells in a RAM cell array are well known in the art. During the fabrication stage, when a failure is detected in a memory cell, the row that contains the defect must be disabled. One method known in the art of disabling a row of memory is to use a hard fuse. A hard fuse is a miniature fuse fabricated from metal and disposed on the silicon. When it is desired to disable a particular row of memory, the fuse is severed, typically with a laser.

FIG. 1 shows a prior art system incorporating a RAM cell array with hard fuses. FIG. 1 shows address line 10 coupling address information into address decoder 20. Address decoder 20 then properly directs that address information along address line 30 into RAM cell array 40. RAM cell array 40 is shown with the prior art hard fuses located in a corner of array 40 in area 50.

The use of hard fuses to disable defective rows of memory has certain disadvantages. For example, because of the destructive nature of the laser cutting, the hard fuses must be located away from other sensitive parts on the chip, thus necessitating a larger design footprint.

Further disadvantages resulting from the use of hard fuses can be seen by referring to FIG. 2, which shows a conceptual detail of array 40 and hard fuse area 50.

In a typical operation, a test will be performed on array 40 to verify its integrity prior to sale. A typical array of memory is formed by various row lines 41 and column lines 42. The intersection of these lines forms a memory location 43. In a typical test, each of the many memory locations that comprises a typical memory cell like memory location 43 are cycled through by storing and retrieving data through address line 30. If a defective location is detected, a corresponding hard fuse F1 is severed, rendering the bad location inoperable. Once the test is complete, the finished RAM cell array is then sealed, packaged and cannot be modified.

The critical path of column line 42 is longer that would be necessary if hard fuse F1 was not present. In high speed, high density, micro-electronics, the distance critical signals must travel is of great concern, and short signal paths are desired. Hence, any unnecessary signal path length resulting from the use of hard fuses is a great disadvantage. As is readily apparent, there is a need for a method for disabling defective memory cells that minimizes critical signal paths.

An additional disadvantage is created by the permanency of the hard fuse operation. As mentioned above, after the RAM cell array is tested, it is sealed. As a consequence, if there are further failures after the sealing of the array, the entire array must be scrapped. Thus, there is a need for a fusing method that allows for the detection and elimination of defective memory cell arrays in the field.

The present invention satisfies the foregoing needs through the use of a programmable soft fuse. With a soft fuse, a row of memory containing a defective memory cell may be deactivated using electronic means rather than destructive lasers.

SUMMARY OF THE INVENTION

The present invention relates to the use of a programmable soft fuse for disabling a signal line. A preferred embodiment has the following elements: an electronic switching circuit having an input, an output, and at least one trigger input, a latch coupled to the switching circuit, a control circuit coupled to the latch, and a reset circuit coupled to the latch. In another preferred embodiment of the present invention, a precharge device is included and coupled to the switch and latch.

A method of disabling a data line using a soft fuse is disclosed, including providing a soft fuse having a control means, providing a memory array having a plurality of address lines, providing an address decoder, connecting the soft fuse between the address decoder and the memory array, testing the memory array, locating a bad address line in the array, entering the location of the bad address line into the address decoder, and strobing the control means, causing the programmable fuse to turn off, thus disabling the defective memory cell.

An alternate method is disclosed, which further includes: providing shifting circuitry, connecting the shifting circuitry to the address decoder, the soft fuse circuitry, and the memory array accepting data from the address decoder into the shifting circuitry, and providing the data to a predetermined row in the memory array.

BRIEF DESCRIPTION OF THE DRAWING FIGURES

DETAILED DESCRIPTION OF A PREFERRED EMBODIMENT

Persons of ordinary skill in the art will realize that the following description of the present invention is illustrative only and not in any way limiting. Other embodiments of the invention will readily suggest themselves to such skilled persons having the benefit of this disclosure.

Figure 1:
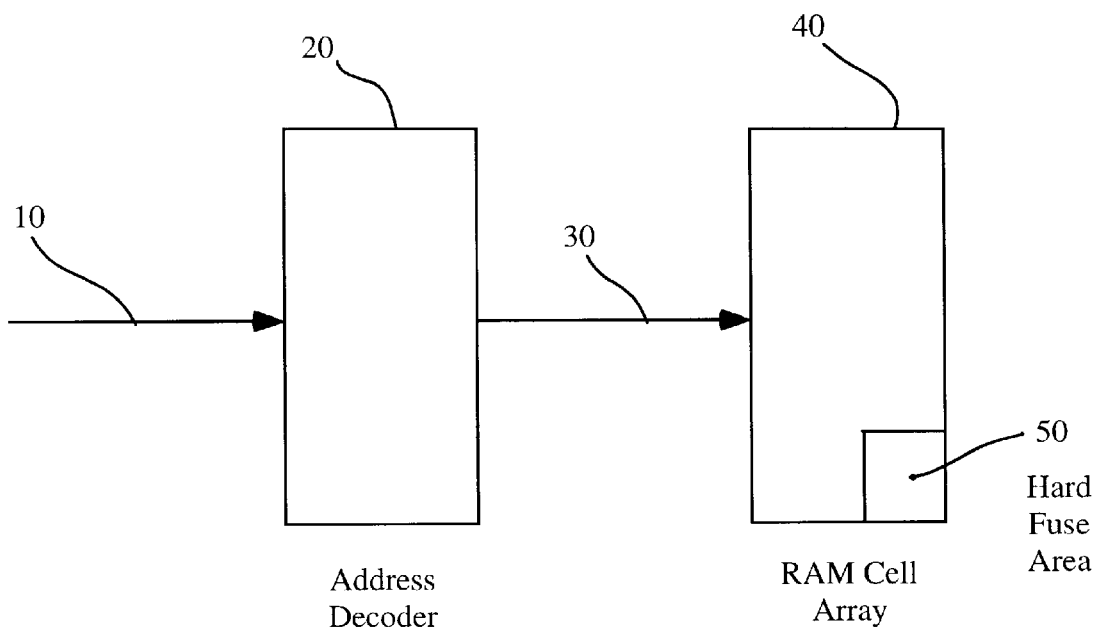
FIG. 1 is a block diagram of the prior art.
Figure 2:
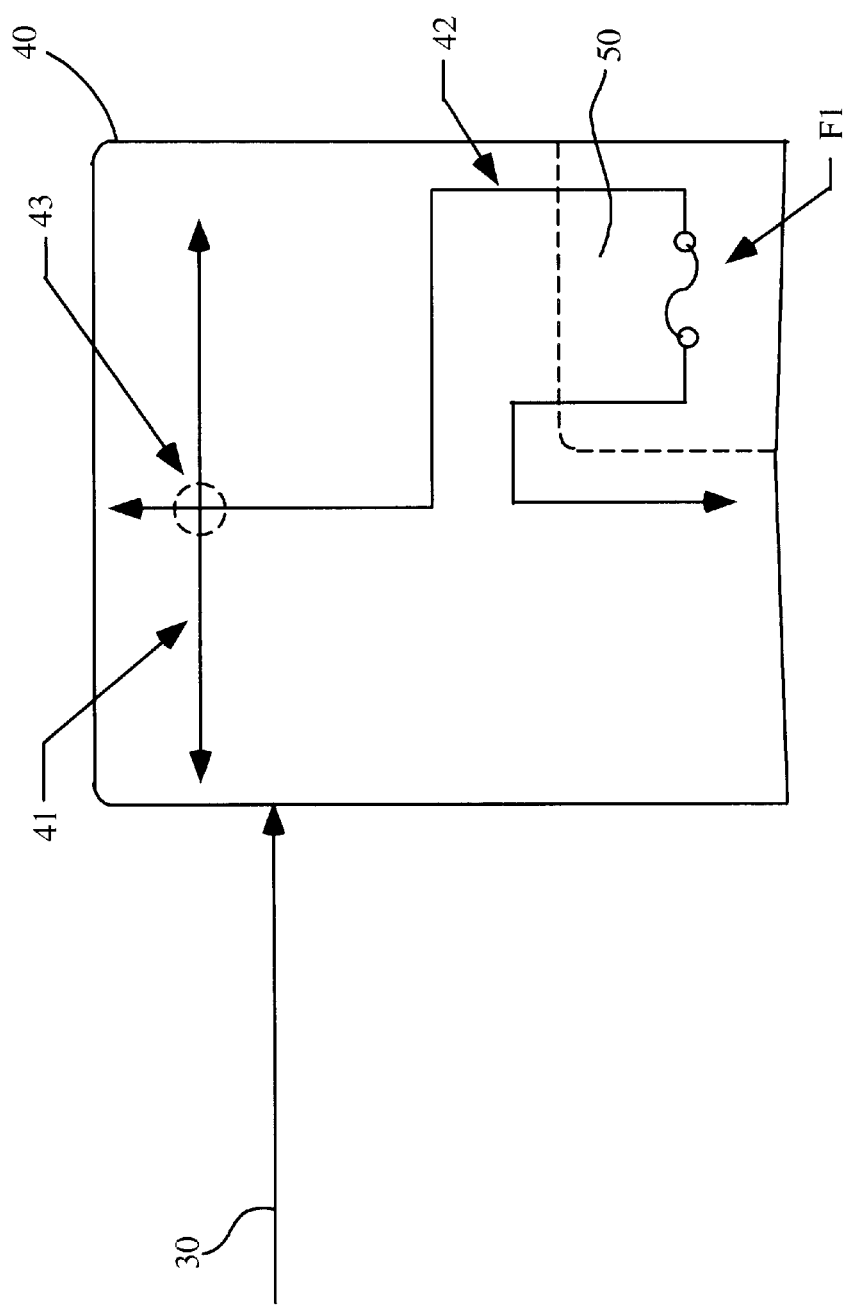
FIG. 2 is a more detailed diagram of the prior art.
Figure 3:
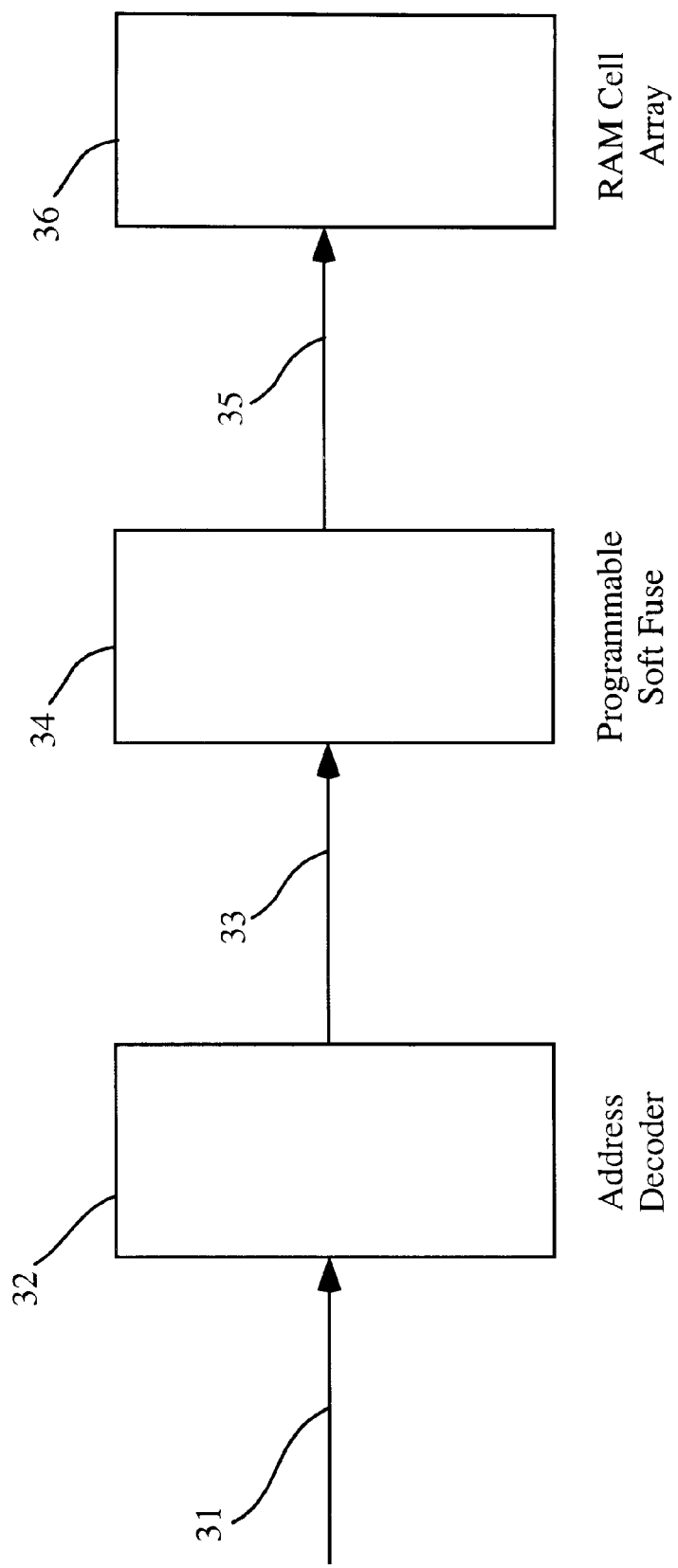
FIG. 3 is a block diagram of the present invention.

FIG. 3 is a block diagram of the present invention. Address information is presented to address decoder 32 on address line 31. Data is output from address decoder 32 and presented to programmable soft fuse 34 via address line 33. Programmable soft fuse 34 is connected to RAM cell array 36 by address line 35. Note that RAM cell array 36 does not contain a hard fuse area, as does the prior art RAM cell array 40 in FIG. 1, resulting in significant area savings.

Figure 4:
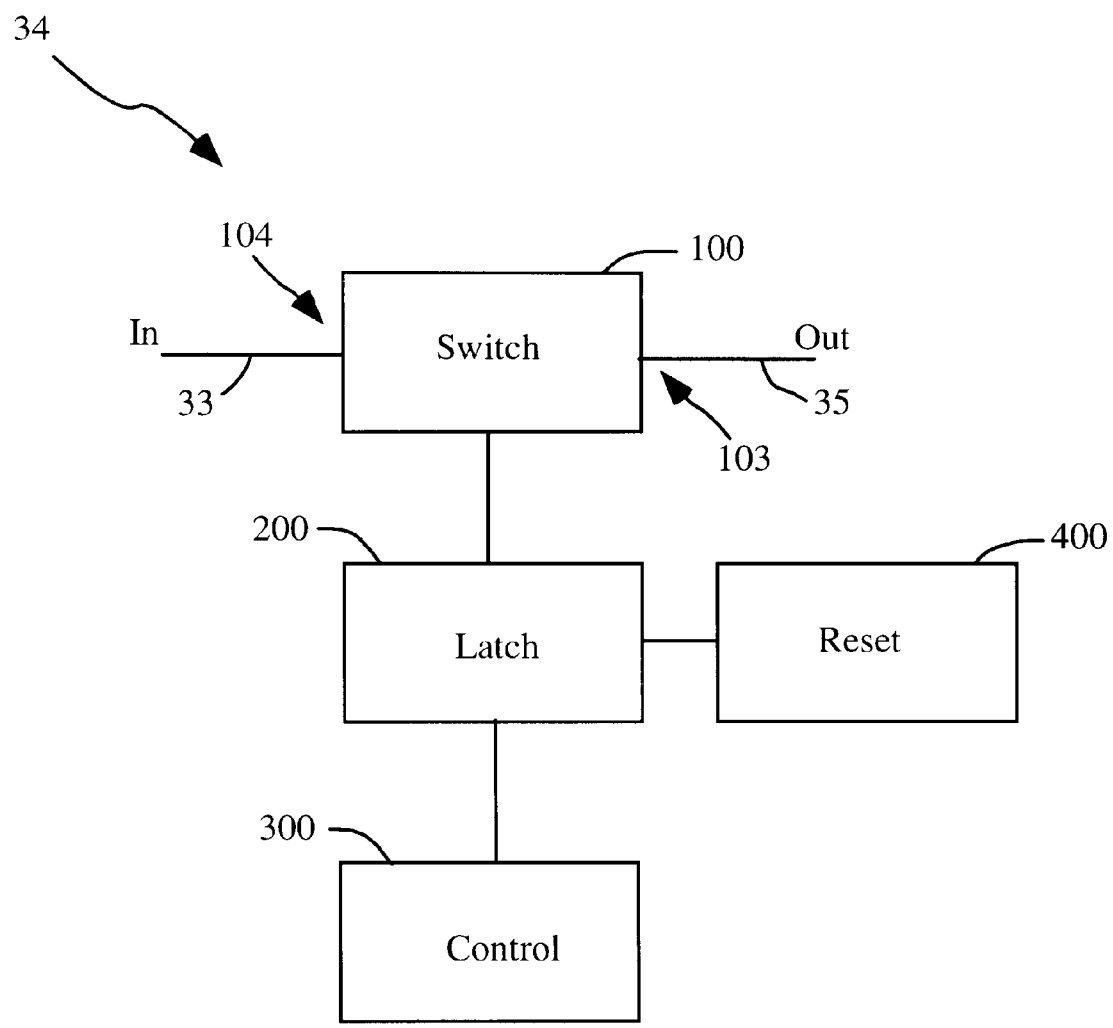
FIG. 4 is a block diagram of a programmable soft fuse according to the present inventition.

FIG. 4 shows a block diagram of a programmable soft fuse according to a preferred embodiment of the present invention. At the center of the soft fuse is electronic switch 100. Switch 100 has an input 104, and an output 103.

Switch 100 is connected to latch 200. Latch 200 is also connected to control circuit 300, and reset circuit 400.

Figure 5B:
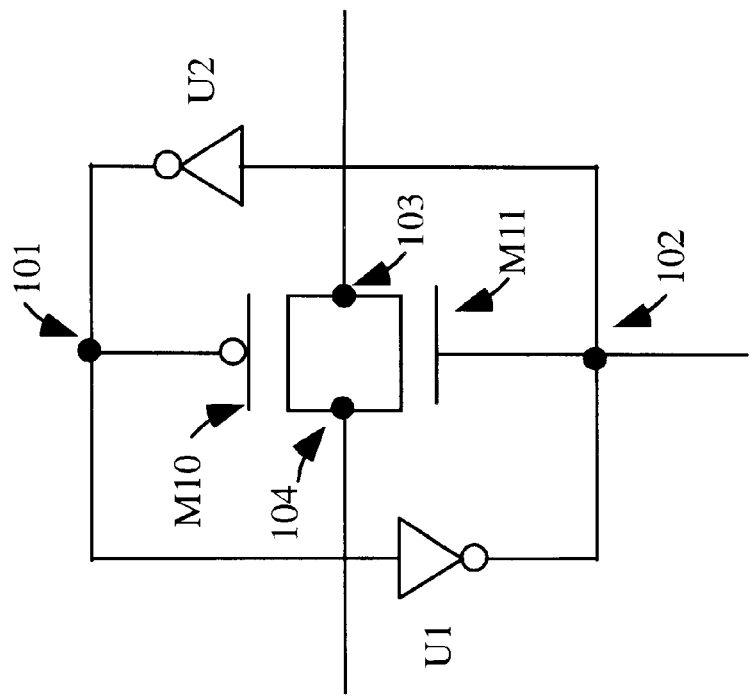
FIG. 5B is a schematic of a prior art soft fuse with a latch.
Figure 5A:
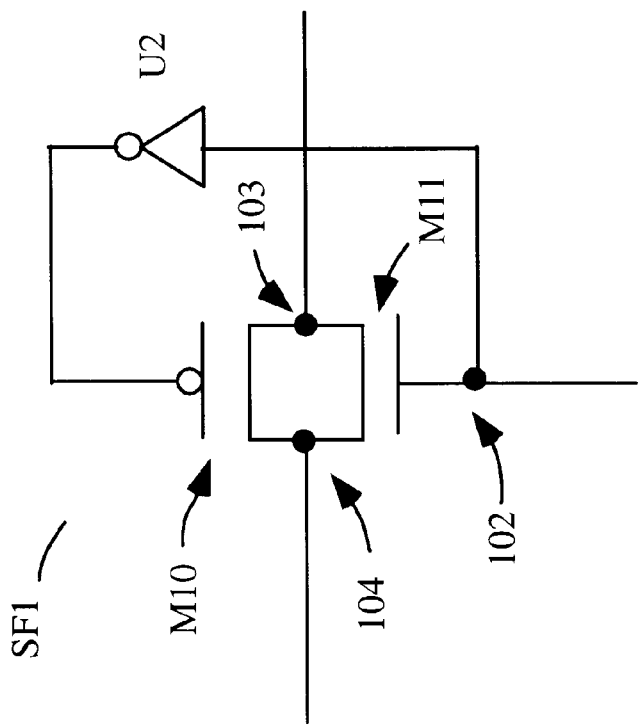
FIG. 5A is a schematic of a prior art soft fuse detail.
Figure 5C:
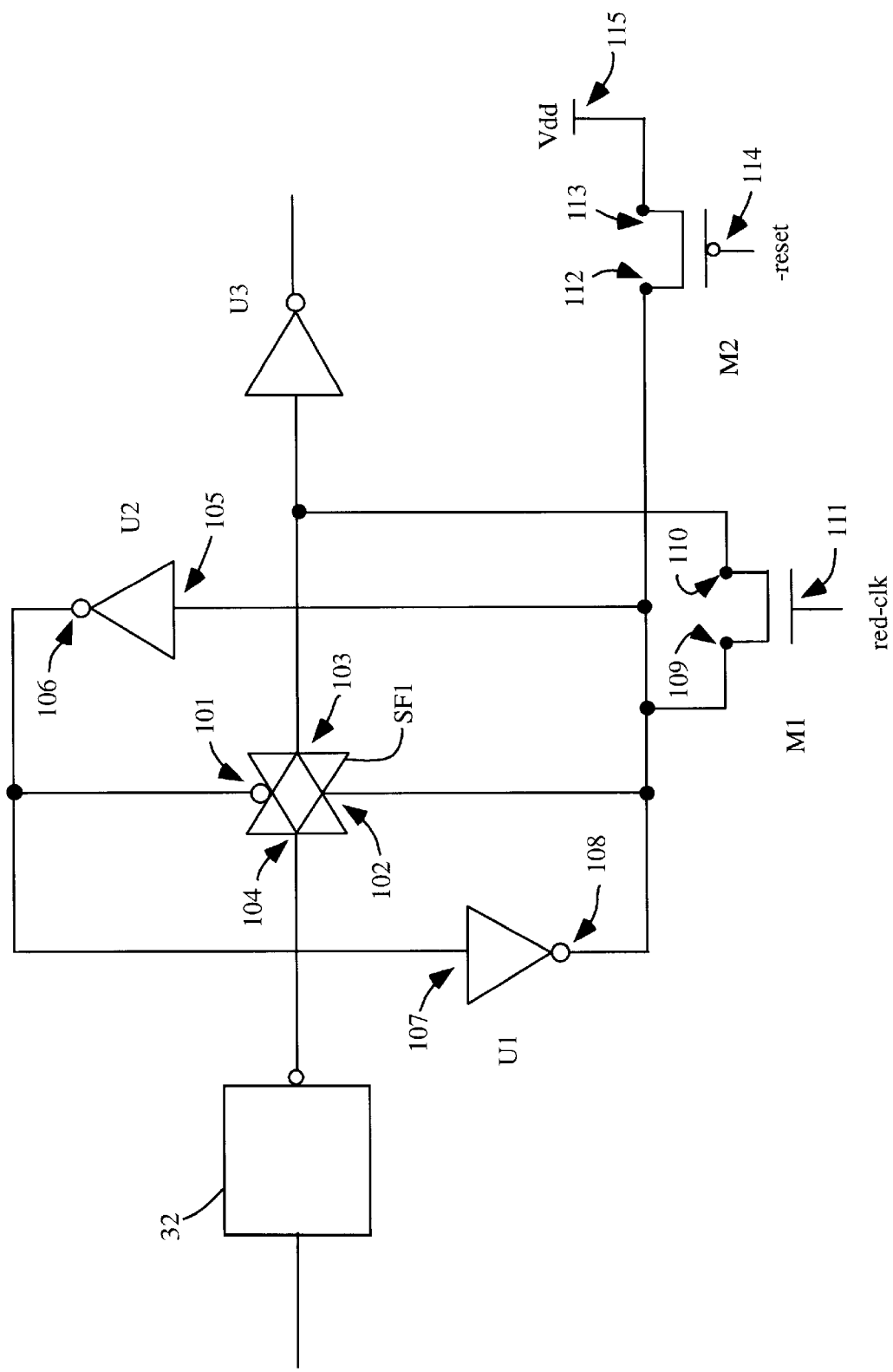
FIG. 5C is a detailed schematic of a programmable soft fuse according to the present invention.

The details of the present invention are best explained by building a present embodiment of the invention step-by-step through the use of FIGS. 5A, 5B, and 5C.

Referring first to FIG. 5A, soft fuse SF1 is shown according to the prior art. In a presently preferred embodiment of the present invention, SF1 comprises PFET M10 and NFET M11 connected in parallel, and inverter U2 connected from the gate of M11 to the gate of M10 forming a passgate. As is known by one skilled in the art, any means suitable for switching an electronic signal on and off may be employed instead of a passgate. SF1 further has an input 104 and an output 103, carried over from FIG. 4, and a trigger input 102. Thus a high signal placed on trigger input 102 will place a high signal on the gate of M11, and a low signal on the gate of M10 through inverter U2. In this condition, SF1 will pass the signal present on input 104 through to output 103.

Referring still to FIG. 5A, when a low signal is placed on trigger input 102, a low signal will be placed on the gate of M11, and a high signal will be placed on the gate of M10 through inverter U2. In this condition, both M10 and M11 will shut off, and hence the signal present at input 104 will not be passed through to output 103.

Referring now to FIG. 5B, a circuit identical to FIG. 5A is shown, with the addition of inverter U1, according to the prior art. Inverter U1 forms a latch in conjunction with inverter U2. As one skilled in the art will appreciate, the present embodiment of the present invention has the advantage of utilizing inverter U1 both part of the passgate within SF1 as well as part of the latch formed by U1 and U2, thus saving both in parts count and silicon space.

Referring now to FIG. 5C, a detailed schematic of a preferred embodiment of the present invention is shown. At the heart of the schematic is soft fuse SF1. For convenience, SF1 is shown by a standard symbol. In the present embodiment, the soft fuse comprises a typical CMOS passgate, such as the one shown in FIG. 5A. SF1 further comprises a first trigger input 101, a second trigger input 102, an input 104, and an output 103. The output of address decoder 32 is provided to SF1. If SF1 is turned on, that output is provided to inverter U3.

In the embodiment of FIG. 5C, inverters U1 and U2 together comprise a latch. Inverter U1 has an input 107 and an output 108. Inverter U2 has an input 105 and an output 106. Input 107 of U1 is connected to the output 106 of U2; output 108 of U1 is connected to input 105 of U2 and to second trigger input 102 of SF1, and output 106 of U2 is connected to input 107 of U1 and to first trigger input 101 of SF1. As is known by one skilled in the art, any means for latching an electronic signal is suitable for use with the present invention and embodiment shown in FIG. 4.

Referring still to FIG. 5C, NFET M1 comprises the control circuitry 300 in the present embodiment as shown if FIG. 4. M1 comprises drain 109, source 110, and gate 111. Drain 109 of M1 is coupled to second trigger input 102 of SF1 and to input 105 of inverter U2. Source 110 of M1 is connected to output 103 of SF1. Gate 111 is connected to a suitable source for a redundancy clock (red_clk). As is known by one skilled in the art, any means for providing an electronic signal such as red_clk to SF1 is suitable for the present invention.

Referring still to FIG. 5C, PFET M2 comprises the reset circuitry 400 of FIG. 4. PFET M2 comprises drain 112, source 113, and gate 114. Drain 112 of M2 is coupled to drain 109 of M1, second trigger input 102 of SF1, output 108 of U1, and input 105 of U2. Source 113 of M2 is connected to positive source Vdd 115. Gate 114 of M2 is connected to a suitable source for a negative triggering reset signal (−reset). M2 serves as a precharge device to ensure that the soft fuse is initially in an ON state. As is known by one skilled in the art, any means for accepting a −reset signal and coupling Vdd to second trigger input 102 of SF1 and to input 105 of inverter U2 is suitable for the present invention.

Referring still to FIG. 5C, the operation of the present embodiment will now be described.

In a typical situation, operation of the present embodiment begins by applying a logical low trigger −reset signal to gate 114 of M2. This −reset signal activates M2, causing the positive potential of Vdd 115 to be applied to second trigger input 102 of SF1, and input 105 of inverter U2. With a logical high present at input 105 of U2, a logical low will now be present at output 106 of U2. This logical low will then be present at first trigger input of SF1, as well as input 107 of U1.

The result of this operation is that with a logical low at second trigger input 102 of SF1, and a logical low present at first trigger input 101, SF1 will be turned on, and inverters U1 and U2 will be locked in a lached state, ensuring that SF1 will remain on. At this point, the −reset signal will be returned to a positive state, deactivating PFET M2.

With SF1 turned on, data from address decoder 32 passes through SF1. Typically, the output stage of address decoder 32 will include an inverting output. Therefore, when a location of a bad memory cell is load into address decoder 32, this normally high signal provided to address decoder 32 will be inverted and provided to SF1 as a low signal, and will be re-inverted by U3 before being passed to a RAM cell array. As is appreciated by one skilled in the art, if address decoder does not include an inverting output, inverter U3 will not be required for proper operation of the present invention.

Referring still to FIG. 5C, the process for triggering SF1 and deactivating a respective line will now be described. When it is desired to deactivate a particular line, the red_clk signal present at gate 111 of M1 will be brought high. Recall that at this point a negative potential is present at output 103 of SF1 due to the decoding of the address pointing to the defective row. Hence, this low is present at source 110 of M1. Accordingly, when M1 is activated by the red_clk signal, this logical low is passed to drain 109 of M2, and hence to second trigger input 102 of SF1 and input 105 of U2. With a logical low present at input 105, a positive signal appears at output 106 of U2. This high signal is then present at first trigger input 101 of SF1 and input 107 of U1. The result of this operation is that with a logical high signal present at trigger input 101 of SF1, and a logical low signal present at second trigger input 102 of SF1, SF1 turns off, thus interrupting the data flow from address decoder 32 to inverter U3. Furthermore, inverters U1 and U2 are now lached in this state, and will ensure that SF1 remains off until a −reset signal is applied to PFET M2.

Figure 6A:
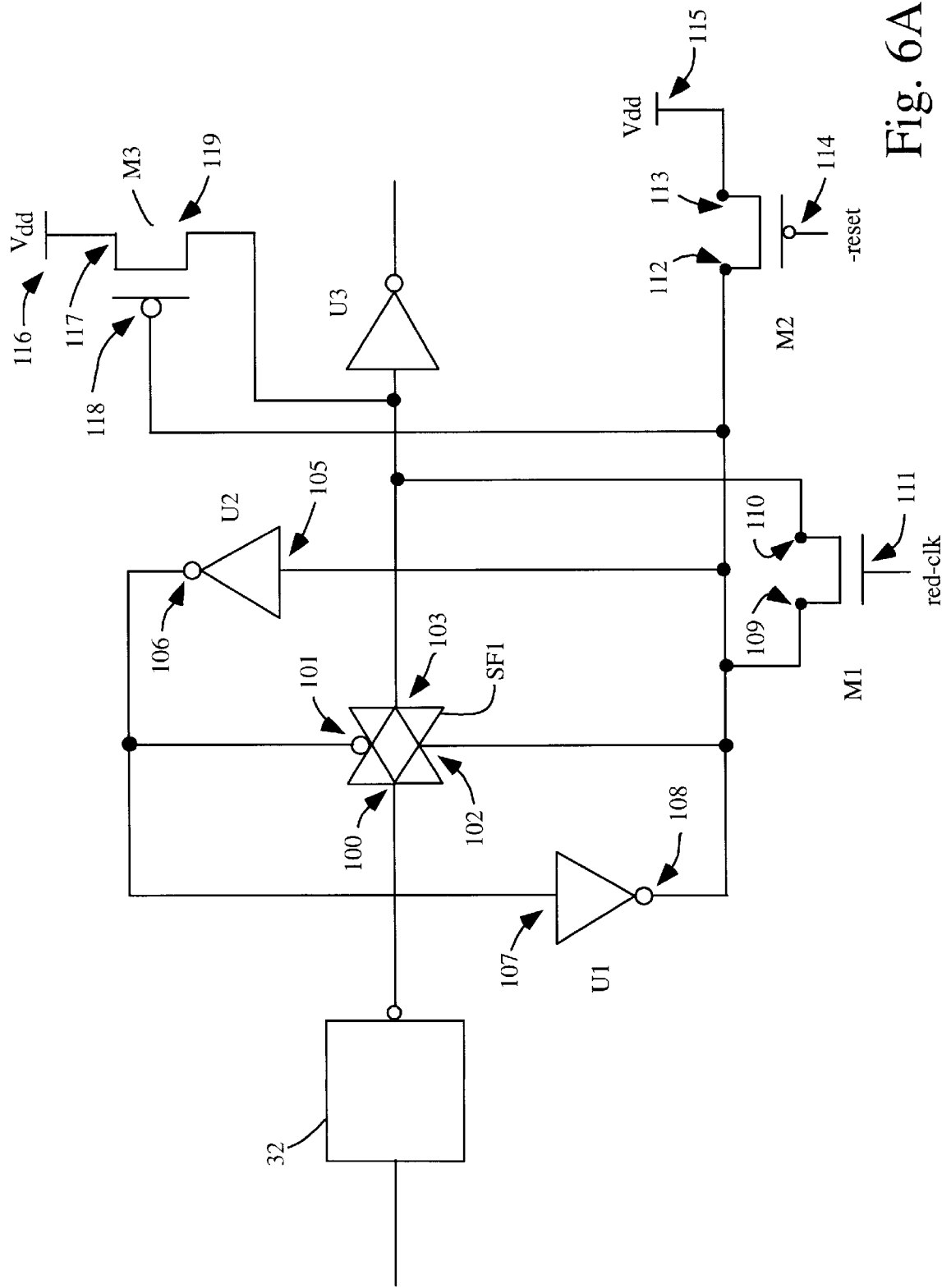
FIG. 6A is a detailed schematic of an improved programmable soft fuse according to the present invention.

Referring now to FIG. 6A, an improved embodiment of a programmable soft fuse is shown. The schematic is identical to that shown in FIG. 5, except that PFET M3 is added. M3 comprises a source 117, a gate 118, and a drain 119. Source 117 is connected to a positive potential Vdd 116. The drain 119 of M3 is connected to output 103 of SF1 and to the input of inverter U3. Gate 118 of M3 is connected to second trigger input 102 of SF1 and input 105 of inverter U2. The purpose of adding M3 to the circuit is to ensure that the line connecting SF1 and U3 remains low when a defective memory cell is deactivated.

Figure 6B:
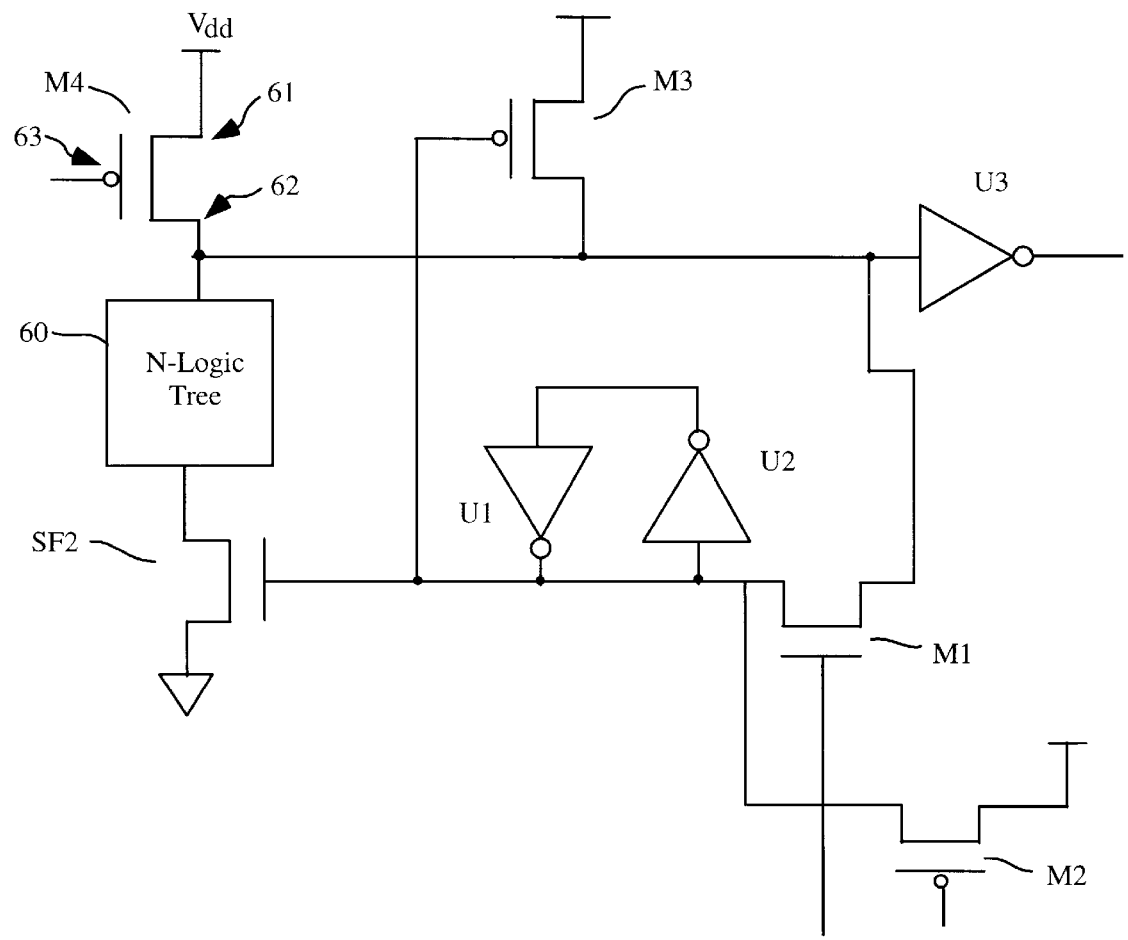
FIG. 6B is a schematic of a programmable soft fuse deployed in a stack according to the present invention.

Referring now to FIG. 6B, an alternate embodiment a soft fuse circuit is shown. While previous embodiments have shown the soft fuse in the form of a transmission gate, FIG. 6B shows the soft fuse in the form of an additional MOSFET in series with one of the gates in the final stages of the decoder. FIG. 6B shows an N-logic tree 60 connected to NFET SF2, which functions as the soft fuse in this embodiment. Additionally, PFET M4 is shown. M4 functions as a pre-charge device. M4 has drain 61 connected to a positive potential Vdd, source 62 connected to N-logic tree 60, and gate 63 of M4 connected to any suitable charging source, such as a clock. Elements U1, U2, U3, M1, M2, and M3 all function in a substantially similar manner as they did in FIG. 6A. Configuring the soft fuse in a stack can have several advantages. For example, a properly configured stack arrangement can occupy less area than a similar transmission gate configuration. As is known by one skilled in the art, this stack arrangement may be necessary if a NOR gate is used as the final decoder stage.

Figure 7:
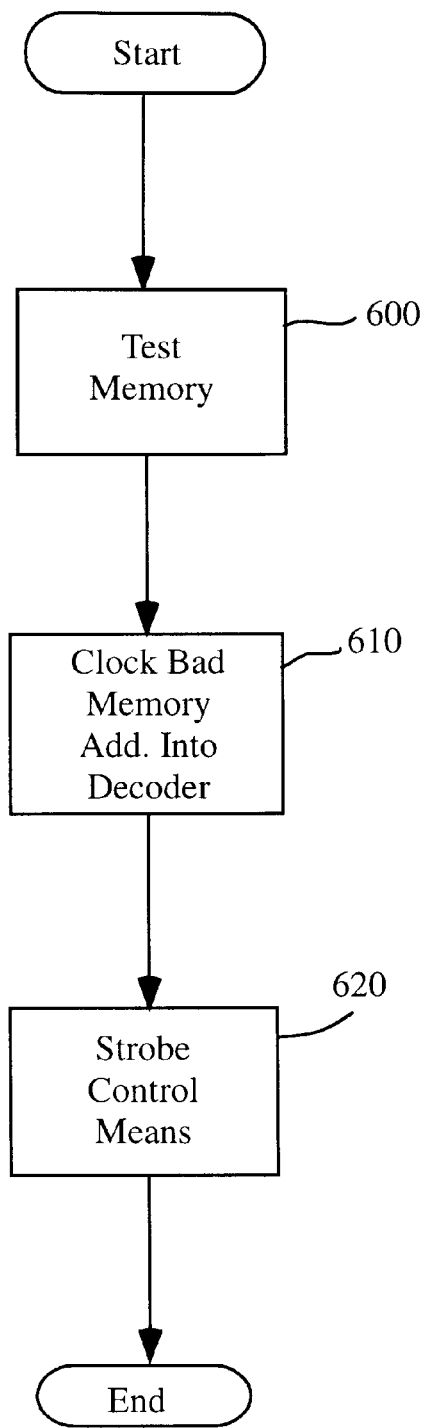
FIG. 7 is a flow chart of the basic steps for programming a soft fuse according to the present invention.

Referring now to FIG. 7, the basic steps for programming a soft fuse circuit are now presented in a flowchart format. In step 600, the RAM cell memory array is tested. This may be accomplished with any testing method, such as a Built-In Self Test (BIST). Bad memory locations detected during BIST are then individually clocked into an address decoder in step 610. As each bad memory address is clocked in to the decoder, the decoder decodes the address, and the control circuitry is strobed in step 620. In one embodiment of the present invention, this is accomplished by applying the red_clk signal to gate 111 of NFET M1 as shown in FIG. 6, after a low signal appears at output 103 of SF1.

Figure 8:
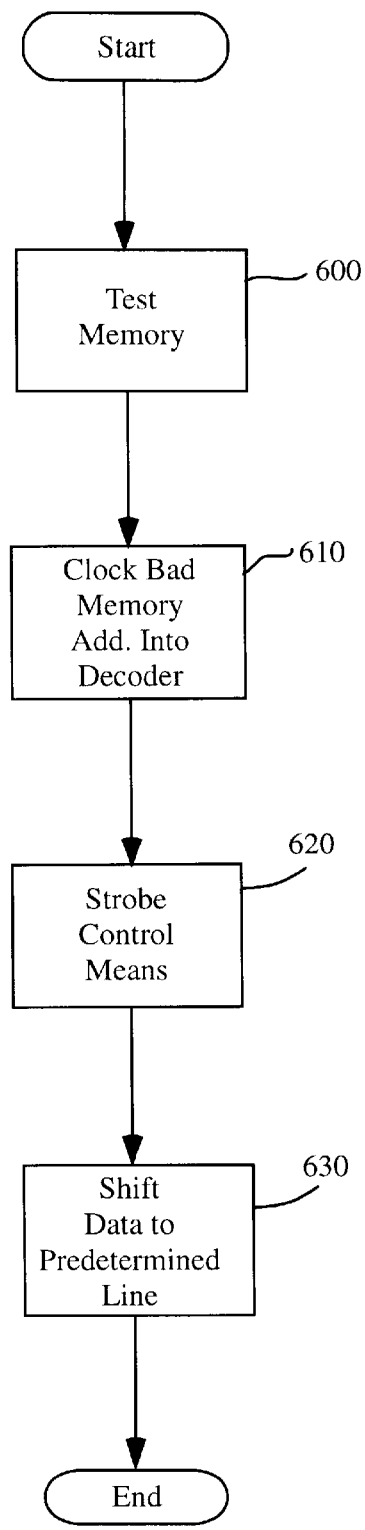
FIG. 8 is a flow chart showing the steps for programming a soft fuse with row shifting according to the present invention.

It is often desirable, however, to shift the address data to a predetermined row as well as disabling the bad row. FIG. 8 presents the steps for soft fuse programming with row shifting. Steps 600, 610, and 620 are the same steps as presented in FIG. 7. FIG. 8 adds the additional step 630. This step shifts the address data to a predetermined row in the RAM cell array. As is appreciated by one skilled in the art, typically the address data will be shifted to a memory cell that is otherwise unused.

This step may be accomplished through any standard circuitry, including standard logic circuits or CMOS pass-gates. Additionally, it is contemplated that many different shifting schemes are possible. For example, it may be desirable to shift data to the top or bottom of a RAM cell array, or to shift data more than one row at a time.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method of disabling a data line using a soft fuse, said method comprising:

providing a soft fuse;

said soft fuse having a control circuitry;

providing a memory array having a plurality of address lines;

providing an address decoder;

connecting said soft fuse between said address decoder and said memory array;

testing said memory array;

locating a bad address line in said array;

entering the location of said bad address line into said address decoder; and strobing said control circuitry.

2. The method of claim 1, said method further comprising:

providing shifting circuitry;

connecting said shifting circuitry to said address decoder, said soft fuse circuitry, and said memory array;

accepting data from said address decoder into said shifting circuitry; and providing said data to at least one predetermined row in said memory array.

3. A method of disabling a data line using soft fuse means, said method comprising:

providing soft fuse means;

said soft fuse having control means;

providing a memory array having a plurality of address lines;

providing an address decoder;

connecting said soft fuse means between said address decoder and said memory array;

testing said memory array;

locating a bad address line in said array;

entering the location of said bad address line into said address decoder; and strobing said control means.

4. The method of claim 3, said method further comprising:

providing shifting means;

connecting said shifting circuitry to said address decoder, said soft fuse circuitry, and said memory array;

accepting data from said address decoder into said shifting means; and providing said data to at least one predetermined row in said memory array.

* * * * *